United States Patent
Sela

(10) Patent No.: US 10,908,191 B2
(45) Date of Patent: Feb. 2, 2021

(54) SYSTEM AND METHOD FOR DETECTION OF ELECTRICAL FAULTS IN AN ELECTRICAL NETWORK

(71) Applicant: ISRA-JUK ELECTRONICS LTD., Petach-Tikva (IL)

(72) Inventor: Isaac Sela, Petach Tikva (IL)

(73) Assignee: Isra-Juk Electronics Ltd., Petach-Tikva (IL)

( * ) Notice: Subject to any disclaimer, the term of this patent is extended or adjusted under 35 U.S.C. 154(b) by 473 days.

(21) Appl. No.: 15/521,922

(22) PCT Filed: Oct. 28, 2015

(86) PCT No.: PCT/IL2015/051054
§ 371 (c)(1),
(2) Date: Apr. 26, 2017

(87) PCT Pub. No.: WO2016/067289
PCT Pub. Date: May 6, 2016

(65) Prior Publication Data
US 2017/0336444 A1    Nov. 23, 2017

(30) Foreign Application Priority Data
Oct. 31, 2014 (GB) .................................. 1419377.5

(51) Int. Cl.
G01R 19/165  (2006.01)
H02H 3/38  (2006.01)
H02H 1/00  (2006.01)
H02H 3/50  (2006.01)
(Continued)

(52) U.S. Cl.
CPC ... *G01R 19/16528* (2013.01); *G01R 19/2513* (2013.01); *G01R 31/50* (2020.01);
(Continued)

(58) Field of Classification Search
CPC .......... G01R 19/16528; G01R 19/2513; G01R 31/02; H02H 1/0092; H02H 3/00; H02H 3/38; H02H 3/50; H02H 7/22
See application file for complete search history.

(56) References Cited

U.S. PATENT DOCUMENTS

| 4,893,063 A | 1/1990 | Pernyeszi |
| 5,963,410 A | 10/1999 | Iijima et al. |

(Continued)

FOREIGN PATENT DOCUMENTS

JP    H11-77298    3/1999

OTHER PUBLICATIONS

International Search Report of PCT Application No. PCT/IL2015/051054 dated Feb. 11, 2016.
(Continued)

*Primary Examiner* — Elias Desta
(74) *Attorney, Agent, or Firm* — Pearl Cohen Zedek Latzer Baratz LLP

(57) ABSTRACT

A method and a system for detecting and processing one or more deviations from an acceptable electrical behavior at a point of interest in an electrical network, the system comprising a voltage sensor and/or a current sensor, a measurement-processor configured to process measurements received from the at least one of a voltage sensor and a current sensor, at least one storage for storing one or more acceptable values related to the electrical behavior at the point of interest, and a deviation-processor, the deviation processor is configured to receive one or more detected values related to the electrical behavior at a point in time at the point of interest and detect one or more deviations between the one or more acceptable values and the one or (Continued)

Waveform of current drawn by a load at multiple repetitive patterns operation – AC system The voltage at the checking point will be:
Vpoint = Vin(t) − Rp(t)*I(t)

more detected values, and analyze one or more deviations between the one or more acceptable values and the one or more detected values.

20 Claims, 11 Drawing Sheets

(51) Int. Cl.
    *H02H 7/22*     (2006.01)
    *G01R 19/25*     (2006.01)
    *G01R 31/50*     (2020.01)

(52) U.S. Cl.
    CPC ............ *H02H 1/0092* (2013.01); *H02H 3/38* (2013.01); *H02H 3/50* (2013.01); *H02H 7/22* (2013.01); *H02H 1/0007* (2013.01)

(56) References Cited

U.S. PATENT DOCUMENTS

| | | | |
|---|---|---|---|
| 6,601,002 B1 | 7/2003 | Ennis et al. | |
| 6,633,823 B2* | 10/2003 | Bartone | H02J 3/14 700/295 |
| 7,571,028 B2* | 8/2009 | Lapinski | H02J 13/0079 700/286 |
| 7,747,879 B2 | 6/2010 | Tofigh et al. | |
| 2004/0039537 A1 | 2/2004 | Ennis et al. | |
| 2004/0064272 A1 | 4/2004 | Ennis et al. | |
| 2008/0204044 A1 | 8/2008 | Ponnaluri et al. | |
| 2008/0204954 A1 | 8/2008 | Bickel | |
| 2009/0167315 A1 | 7/2009 | Lindsey | |
| 2009/0179631 A1 | 7/2009 | Hu et al. | |
| 2010/0332173 A1 | 12/2010 | Watson et al. | |
| 2012/0229939 A1 | 9/2012 | Mikani et al. | |
| 2019/0098090 A1* | 3/2019 | Binder | H04L 67/12 |

OTHER PUBLICATIONS

Great Britian Search Report of GB Application No. GB1419377.5 dated May 12, 2015.

Search Report dated Jul. 9, 2018 for European Patent Application No. 15855811.4.

* cited by examiner

Waveform of current drawn by a load at multiple-repetitive patterns operation – pulsating DC system The voltage at the checking point will be:
$V_{point} = V_{in}(t) - R_p(t) * I(t)$

SYSTEM AND METHOD FOR DETECTION OF ELECTRICAL FAULTS IN AN ELECTRICAL NETWORK

CROSS REFERENCE TO RELATED APPLICATIONS

This application is a National Phase Application of PCT International Application No. PCT/IL2015/051054, International Filing Date Oct. 28, 2015, claiming priority of GB Patent Application No. 1419377.5 filed on Oct. 31, 2014, all of which are incorporated herein by reference in their entirety.

BACKGROUND OF THE INVENTION

Detecting faults in an electrical device or an electrical network has a major safety and preventive-maintenance impact, particularly detecting the faults before a critical incident has happened. Presently, faults can be detected only after the electrical fault caused a failure in the device, affected the electrical device or an electrical grid or net supplying power to the device. For example, some electrical faults can be detected after a smell of burned polymer is spread in a space in close proximity to the failing device or electrical system. Other electrical faults are detected after a fuse or an electrical circuit becomes damaged or burned. In yet another example, a fault can be detected when a fuse, circuit-breaker or plug included in a fuse box associated with the grid has tripped.

Electrical fault can cause short circuit and spark that may in return start a fire. The higher the amount of combustible material near by the spark—the higher is the chance that a fire will start. For example, wood or timber houses are more flammable than brick houses, thus more sensitive to sparks. Currently, the only way to detect electrical faults, in domestic or industrial facilities, before critical incident has happened, is periodically examine the various devices and the electric network in the facility, by an electrician.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
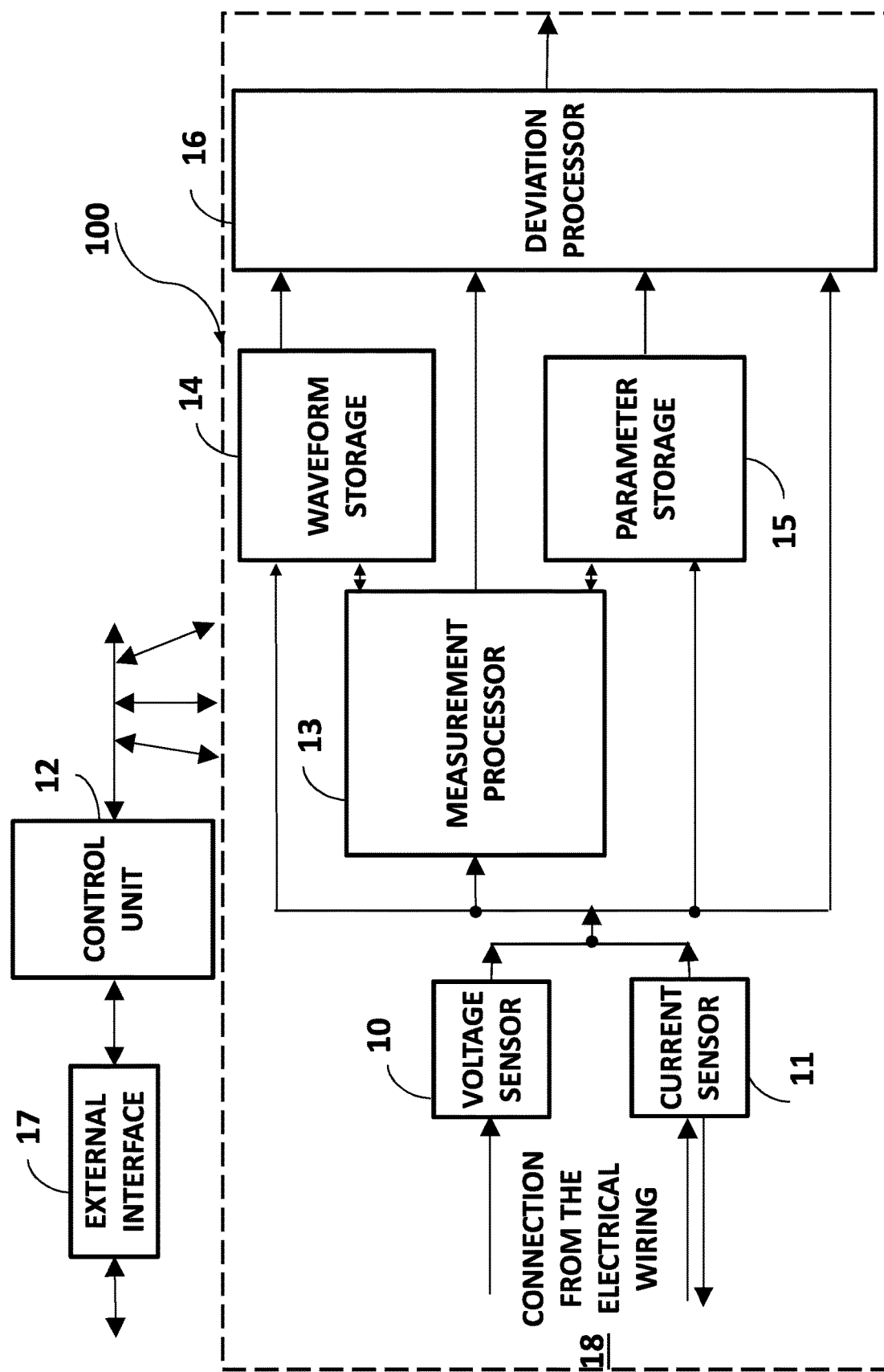
FIG. 1 is a high level block diagram of an exemplary system for detecting deviations from an acceptable electrical behavior according to some embodiments of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

Some aspects of the present invention may be related to a method and a device for automatically and continuously monitoring and detecting electrical faults in an electrical device connected to an electrical network or in the electrical network itself (e.g., a grid or a distribution network). The electrical network may be connected to an external grid or power supply, for example, a power supplied by a utility company, or may be connected to an independent power source, for example, a battery in a car. According to aspects of the invention faults may be detected prior to the occurrence of a critical incident. A critical incident in an electrical device or an electrical network may be defined as any incident that may harm the device or the electrical network, for example, cause a spark, or may result in any other incident that may have a safety or operational impact.

Embodiments of the invention may be directed to automatically and continuously monitoring and detecting electrical faults by detecting deviation from an acceptable electrical behavior of the device or the electrical network at a particular point at the electrical network. As used herein, electrical behavior at a point in the electrical network may be defined by one or more values of one or mare parameters associated with voltage and/or current patterns at that point that are indicative of the behavior of the device and/or the electrical network at the point. For example, an electrical behavior may be related to: the entire voltage pattern (AC or DC), the entire current pattern (AC or DC), minimum and maximum values of the voltage and/or current patterns, number of expected repetition-patterns of the voltage and/or current patterns, a time derivative of the current and/or voltage waveforms or the like. A list of optional values related to the electric behavior is given in table 1:

TABLE 1

| Value/parameter(s) | Current | Voltage |
| --- | --- | --- |
| Pattern | Unidirectional or bidirectional | AC, Pulsating DC, |

TABLE 1-continued

| Value/parameter(s) | Current | Voltage |
|---|---|---|
| | | constant DC |
| Periodicity | ✓ | ✓ |
| Number of expected repetition-patterns | ✓ | ✓ |
| Number of voltage/current cycles before stability check should start | ✓ | ✓ |
| Number of successive same-pattern cycles required to be declared as "stable pattern" | ✓ | ✓ |
| Expected period duration | ✓ | ✓ |
| Min/Max input voltage | ✓ | ✓ |
| Min/Max voltage allowed at the point being checked | ✓ | ✓ |
| Allowed-delta on time-intervals - when a load (e.g., device) is active | ✓ | ✓ |
| Allowed-delta on time-intervals - when a load (eg., device) is not active | ✓ | ✓ |

An acceptable electrical behavior according to some embodiments of the invention may include acceptable value or values of one or more parameters associated with voltage and/or current patterns at a specific device (i.e., load) and/or electrical network at a particular point of interest work at an acceptable working conditions. The acceptable working conditions may be working conditions of the load and/or the electrical network at which no incident, faults and/or failure are in risk to happen.

In a state-of-the-art voltage and current-measurement technologies used, digital values are received from analog-to-digital units. The analog-to-digital units may be embodied as one or more discrete devices and/or one or more sub-blocks of a larger device. The input span of most analog-to-digital devices is limited to several volts. In many cases and especially when measuring voltages and/or currents in an electrical network, analog attenuation networks are used. Many factors that vary over time, without a direct relation to the measured value, affect the measured values that may be received from the analog-to-digital unit. Some examples of such factors may include, power-supply noises, attenuation-changes due to temperature changes of a component and the circuitry of the analog-to-digital units themselves. These factors may cause the measured-values obtained from the analog-to-digital units to vary over time even when the measured signal does not change. When the measured signal changes over time, the time-relation between the variations of the measured signal and the timing of the analog-to-digital conversion process may also affect the values that will be obtained from the analog-to-digital conversions.

One of the characteristics of the analog-to-digital conversions is the resolution. The resolution of the analog-to-digital unit may specify the number of bits in a digital values obtained from the analog-to-digital unit. When the resolution is related to a measurement circuit that includes the analog-to-digital unit and its input-circuitry, the resolution specifies the minimal change in the measured analog-signal that will affect the digital result of the measurement. The resolution may sometimes be expressed as "weight of the least-significant-bit" in the digital result.

Due to the above mentioned reasons for input-independent changes in the results of analog-to-digital conversions, minor changes between the expected values and the actually obtained values are expected to occur in almost every measurement. Therefore, some embodiments of the present invention may include determining what deviations are meaningful deviations (e.g., deviations larger than a threshold value) that may indicate a fault in the system and what deviations are negligible deviations (e.g., deviations smaller than a threshold value) that may occur due to the minimal changes in the digital signal.

As used herein, a point of interest at an electrical network may be any point in which detecting deviations from acceptable electrical behavior may allow prediction and prevention of a critical incident in any of the devices or loads connected to the network or prevent critical incident at the network's wires and conducting system. A point of interest may be at an electrical vicinity of the at least one load or device, for example at a socket of an air-condition system or a washing machine. In yet another example, the point of interest may be at any point in a particular branch included in the network. The acceptable electrical behavior values may be determined for each particular point of interest, for example at a particular socket. In yet another example, the point of interest may be at a junction in the electric network, wherein the junction connects two or more loads and the acceptable electrical behavior may include a superposition of the acceptable electrical behavior of the two or more loads. In the above-mentioned examples, related to residential or office electrical distribution, the point of interest is in part of the electrical network may be under a responsibility of the electricity consumer. In yet another example, the point of interest may be at the part of the network that is between the source of the power supplied by the utility company and the entry point to the consumer premises (e.g., the fuse box). Electrical wiring in the streets may be an example for such segment of the electrical network. In yet another example, the electrical network may be a DC network that supplies DC voltage to fans that are part of a home heating & ventilating system.

As used herein, a load may be any electrical device that consumes electricity from an electrical network. Some exemplary loads that may be connected to a domestic network may include: washing machines, refrigerators, air conditioning systems, dishwashers, DVD, televisions, electric stoves, ovens, fans, or the like. Some exemplary industrial loads may include industrial air conditioning and ventilation systems, saw-mills, furnaces, or the like.

A system for detecting deviations from an acceptable electrical behavior may be connected at a particular point of interest in the electrical grid. The acceptability of the electrical behavior at that point may be determined, for example, by analyzing one or more deviations between the one or more acceptable values related to the electrical behavior and one or more detected values related to the electrical behavior, detected by a voltage sensor and/or a current sensor connected at the point of interest.

Reference is now made to FIG. 1 that presents a high level block diagram of an exemplary system for detecting deviations from an acceptable electrical behavior at a point of interest in an electrical network according to some embodiments of the invention. A monitoring system 100 may include a voltage sensor 10 and/or a current sensor 11, a measurement-processor 13, at least one of waveform storage 14 and/or parameter storage 15, and a deviation-processor 16. Deviation-processor 16 may act as a detector for detecting deviations from an acceptable electrical behavior. Deviation-processor 16 may act as an analyzer for analyzing deviations from an acceptable electrical behavior. Deviation-processor 16 may perform additional functions that may be required to distinguish between negligible deviations and meaningful deviations. In some embodiments, system 100 may further communicate with a control unit 12 and an external interface 17.

Monitoring system 100 may be connected to an electrical network (i.e., grid or electrical distribution system) at a particular point of interest via connection 18. Connection 18 may connect system 100 to the grid via electrical wiring. The grid may supply input voltage (Vin(t)) and/or current (Iin(t)) as a function of time. The input voltage or current may be supplied as alternating (e.g., AC systems), constant or pulsating (e.g., DC systems), as illustrated and will broadly discuss with respect to FIG. 4.

Voltage sensor 10 may be connected to the electrical network via connection 18 and may measure one or more values related to the voltage pattern at the point of interest. Voltage sensor 10 may be any known voltage sensor that is configured to measure one or more values related to the voltage pattern and send signals related to the measured values to: measurement-processor 13, waveform storage 14, parameter storage 15 and/or deviation-processor 16. Current sensor 11 may be any known current sensor that is configured to measure one or more values related to the current pattern and send signals related to the measured values to: measurement-processor 13, waveform storage 14, parameter storage 15 and/or deviation-processor 16.

Measurement-processor 13 may be configured to process signals received from voltage sensor 10 and/or current sensor 11. The signals received may include values related to the voltage waveform from voltage sensor 10 and/or values related to the current waveform from current sensor 11. Measurement-processor 13 may process the received measurements by, for example, cleaning the measurements from undesired noises, adjust offset, or correct any other data-sampling faults in the measurements or values that need to be corrected. Measurement-processor 13 may process the received values in real time during the measurement of each signal or process the received signals afterwards, by using storage elements like waveform storage 14 or similar, for storing received signals for later processing. The processing may include operations like signal and/or noise filtering, low/high/band filtering or rejection, frequency analysis, stability measurements and other signal-processing operations. The object of this block is to determine the acceptable patterns and parameters of the measured voltage and/or current.

The processed signals or values processed by measurement-processor 13 may be stored in waveform storage 14. Additionally or alternatively the values related to the voltage waveform measured by voltage sensor 10 and/or values related to the current waveform may be measured by current sensor 11 may be directly stored in waveform storage 14. Values stored in waveform storage 14 may include temporal values (i.e., values that change with time), for example, a full waveform of the current and/or the voltage, a series of maxima and minima values as function of time for the current and/or the voltage waveforms, the time derivative of the current and/or voltage waveforms over a period of time, repeated-patterns found in the voltage and/or current values, or the like.

The stored values and signals may be further processed to determine at least one acceptable value related to the electrical behavior, for example, by measurement-processor 13 and/or deviation-processor 16. Storage 14 may include or may be included in any storage unit, for example, an electrical memory chip, part of an integrated circuit, a hard disk drive, a floppy disk drive, a Compact Disk (CD) drive, a CD-Recordable (CD-R) drive, a universal serial bus (USB) device or other suitable removable and/or fixed storage unit. Content may be stored in waveform storage 14 and may be loaded from storage 14 to be further processed by measurement-processor 13 and/or deviation-processor 16.

Additionally or alternatively discreet values (e.g., parameters) related to the current waveform and/or to the voltage waveform may be stored in parameter storage 15. Discreet values related to the current waveform and/or to the voltage waveform may include for example a number of repetition-patterns in the voltage and/or current waveform, a number of successive same-pattern cycles, the average length of a repetition, average maximum and minimum values detected over a plurality of waveforms, the time derivative of the current and/or voltage waveforms at particular points in the waveform, or the like.

The discreet values (e.g., parameters) related to the current waveform and/or to the voltage waveform may be received from measurement-processor 13 and/or directly from voltage sensor 10 and/or current sensor 11. Parameter storage 15 may include or may be included in any storage unit, for example, an electrical memory chip, part of an integrated circuit, a hard disk drive, a floppy disk drive, a Compact Disk (CD) drive, a CD-Recordable (CD-R) drive, a universal serial bus (USB) device or other suitable removable and/or fixed storage unit. Content may be stored in parameter storage 15 and may be loaded from storage 15 to be further processed by measurement-processor 13 and/or deviation-processor 16.

In some embodiments, waveform storage 14 and parameter storage 15 may be included in a single storage and the single storage may store all the values related to the voltage and/or current waveforms, for example, the temporal values and the discreet values (e.g., parameters).

Deviation-processor 16 may be any computation platform that is configured to detect one or more deviations from an acceptable electrical behavior at a point of interest in an electrical network, according to some embodiments of the invention. Deviation-processor 16 may include a processor, for example, a central processing unit processor (CPU), a digital device or part of it, a chip or any suitable computing or computational or digital-logic device. Deviation-processor 16 may further include a memory for storing code or instructions to be executed by deviation-processor 16, for example instructions related to a method of detecting one or more deviations from an acceptable electrical behavior at a point of interest in an electrical network. The memory may be any non-transitory readable medium and/or non-transitory storage medium, such as for example a memory, a disk drive, or a USB flash memory for storing instructions, e.g., computer-executable instructions, which, when executed by the deviation-processor 16, carry out methods disclosed herein.

In some embodiments, deviation-processor 16 may be configured to receive from the at least one of: voltage sensor 10 and current sensor 11, one or more detected values related to the electrical behavior at a point in time at the point of interest. The detected values may first be processed by measurement-processor 13 or may be directly received by deviation-processor 16. The electrical behavior may be related to at least one of: a voltage waveform and/or a current waveform.

As used herein, a point in time is the exact time or a period of time at which the one or more detected values related to the electrical behavior were detected. The detection may be continuous or may be conducted every predetermined amount of time, for example, every 30 nano-seconds, every 20 micro-seconds, every 10 minutes, every half an hour or the like. The detection may detect a single value at a single time or may detect a waveform over a predefined period of time. For example, the voltage and/or current values may be measured for 30 seconds every 2 minutes. In yet another embodiment, measurement-processor 13 may detect the cycle time of the measured voltage/current and generate a timing signal that aligns waveform storage 14 and/or parameter storage 15 and/or deviation-processor 16 with the specified pattern.

Deviation-processor 16 may further receive one or more acceptable values related to the electrical behavior at the point of interest. The acceptable values may include voltage-related acceptable values and/or current-related acceptable values. The one or more acceptable values may be received from waveform storage 14 and/or parameter storage 15. Additionally or alternatively the acceptable values related to the electrical behavior at the point of interest may be received from a storage unit associated with an external source, for example, associated with control unit 12. For example, the acceptable values may be associated with the load (e.g., a washing machine) and may be received from the load's manufacturer, for example, via external interface 17 (e.g., over the internet).

In some embodiments, deviation-processor 16 may determine the one or more acceptable values related to the electrical behavior by further analyzing the one or more acceptable values related to an electrical behavior associated with the load received from the external source. Deviation-processor 16 may be configured to receive one or more acceptable values related to an electrical behavior associated with the electric network, for example, the waveforms in FIGS. 4-8 and may determine the one or more acceptable values related to the electrical behavior based on a superposition between the one or more acceptable values associated with the load and the one or more acceptable values associated with the electric network.

Deviation-processor 16 may further be configured to process one or more deviations between the one or more acceptable values and the one or more detected values. The deviation-processor may compare between the detected values and the acceptable values and detect a deviation if the difference(s) between the detected value(s) and the acceptable value(s) is larger than a threshold value.

Deviation-processor 16 may further be configured to send an alert via external interface 17 when the processed deviation is higher than a threshold value. The alert may be send to at least one of a user (e.g., to a mobile phone) and/or an external device, for example, an external control unit (e.g., control unit 12) that controls the entire electrical network of a facility (e.g., domestic or industrial facilities). Such an external control unit may operate upon receiving the alert. For example, control unit 12 may shutdown the entire electricity in the facility. Additionally or alternatively, control unit 12 may automatically invite a technician to fix the detected fault.

Control unit 12 may further be configured to control and communicate with several monitoring systems 100 for detecting one or more deviations from an acceptable electrical behavior at various points of interest in the electrical network. In some embodiments, control unit 12 may communicate with a plurality of monitoring systems 100 in order to improve the accuracy and reliability of deviation analysis and enhance the total fault-location capabilities, for example, by distinguishing between electrical faults at a common line included in the electrical-power utility grid and faults at branches inside a residential electrical network. Control unit 12 may manage a local electrical network at a facility that includes at least two loads (e.g., devices) and wiring connecting the loads to an external grid that supply electric power to the facility. Control unit 12 may further communicate with a user and/or external devices via external interface 17.

In an exemplary embodiment, a system comprising a plurality of monitoring units 100 may more accurately detect a momentary discontinuity on a line (from the utility grid) common to all the facility than a single monitoring unit 100 (although a single unit can detect such fault as well). If such faults may be detected by at least two or more (e.g., most of) monitoring systems 100 from the plurality of monitoring systems 100 connected to control unit, the system may conclude that the fault occurred in the line common to all the facility. In some embodiments, control unit 100 may alert a user or automatically send an alert to the electricity supplier (the utility company). A similar exemplary approach may be applied to the detection of voltage sag on a line common to all the facility (before the entry to the panel-box). If the voltage sag may be detected by most of monitoring systems 100, control unit 12 may be able to conclude that voltage sag occurred in the common part of the electrical distribution system.

In another exemplary embodiment, vibrations on a contactor on the panel-box (e.g., box 220) may be detected by two or more systems 100 communicating with control unit 12. At least one monitoring system 100 on the affected branch may detect an undesired frequency component on the measured voltage and/or current, while the other monitoring systems on other branches may not detect such undesired frequency component Control unit 12 may be able to compare frequency-analysis results from the various monitoring systems, concluding which of the contactors in the panel is generating the undesired frequency component. A similar approach may be conducted for detecting voltage sag on a branch comprising at least one monitoring system 100. If at least one of system 100 (e.g., all the systems) included in a single branch detects a sag in the voltage level while all other systems do not detect such sag, control unit 12 may conclude in which branch the sag occurred and optionally where exactly in the branch the sag is.

External interface 17 may be or may include input devices such as a mouse, a keyboard, a touch screen or pad, connection to a communication network or any suitable input device. External interface 17 may further include output devices such as: one or more displays, speakers, connection to a communication network and/or any other suitable output devices. It will be recognized that any suitable number of output devices may be included in interface 17. Any applicable input/output (I/O) devices may be connected to external interface 17. For example, a wired or wireless network interface card (NIC), a modem, printer or facsimile machine, a universal serial bus (USB) device or external storage device may be included in external interface 17.

Data related to acceptable values related to the electrical behavior related to a specific load (e.g., a specific device such as a heating system, washing machine, refrigerator, oven, furnace, etc.) may be received from an external source via external interface 17. For example, acceptable current and/or voltage waveforms related to a domestic washing machine may be received from the washing machine manufacturer, over the internet or may be uploaded to control unit 12 via external interface 17, by for example, inserting a data disc into a DVD included in interface 17. Such data may be stored in monitoring systems 100 during the manufacturing of monitoring system 100. Such data may also be stored during maintenance activities of monitoring system 100. Data related to the measurements done by monitoring system 100 may be transmitted via external interface 17 to other monitoring systems 100 or other devices, in order to have better fault analysis, fault location, history-data collection, statistics and similar purposes.

Figure 2:
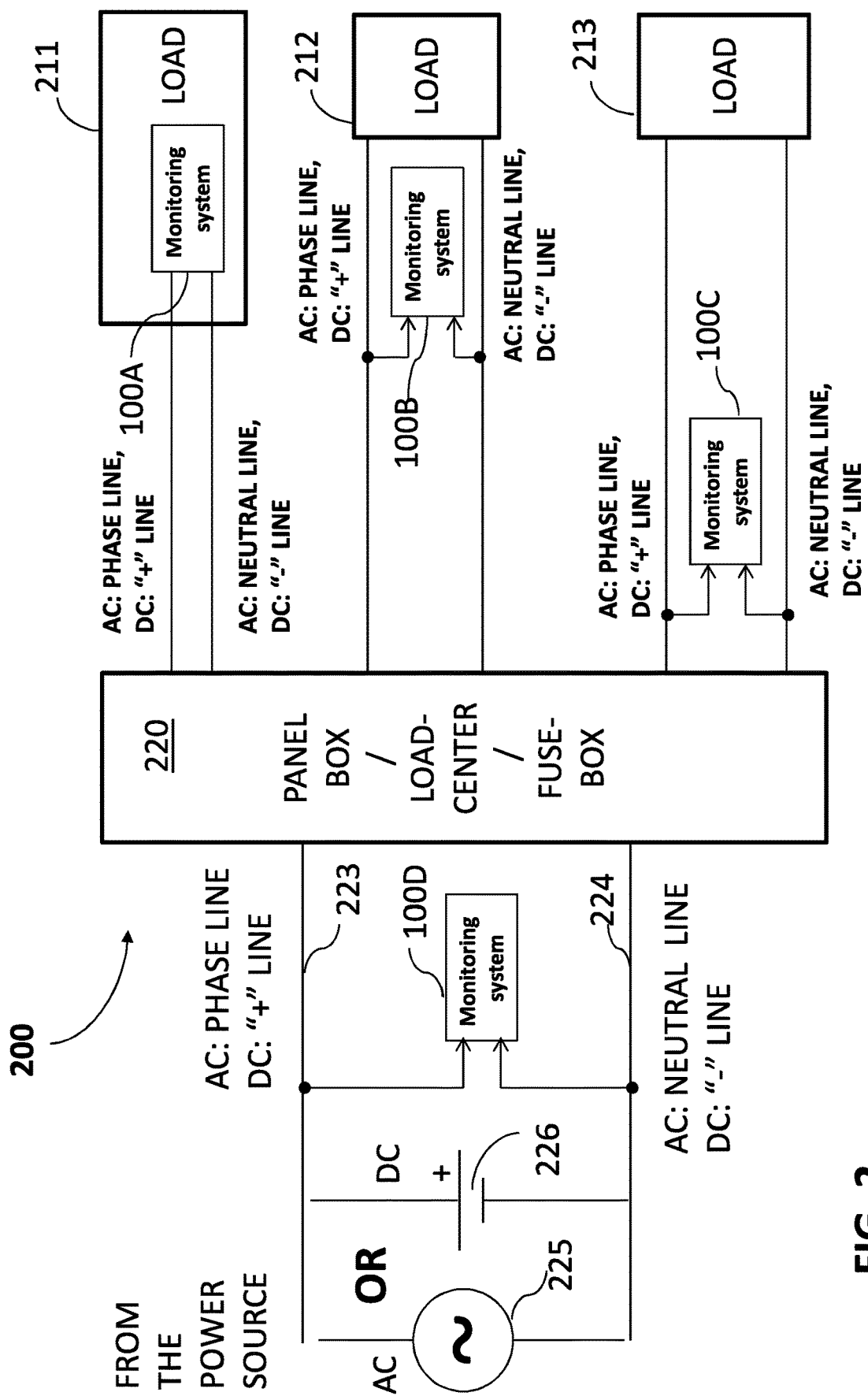
FIG. 2 is a schematic representation of an exemplary electric network according to some embodiments of the invention.

Reference is now made to FIG. 2 that shows a schematic representation of an exemplary electric network according to some embodiments of the invention. Electrical network 200 may include a panel box 220 (also known as a load-center or a fuse-box), two or more loads, for example, loads 221, 212 and 213 and two or more monitoring systems 100A, 100B, 100C and 100D connected at various points of interest. The point of interest may be any point between the source of the electrical power and the loads. Electric network 200 may receive power from a power source via line 224 and/or 223. The power source may be an AC power source 225 or a DC power source 226.

Monitoring systems 100A-100D may be installed at various points of interests in electric network 200. In some embodiments, monitoring system 100A may be located in electrical vicinity to load 211, such that system 100A is included in the electrical circuitry of load 211. In such case system 100A is plugged into network 200 via the plugs included in load 211. For example, system 100A may be included and connected to the control panel of a washing machine and may be connected to a domestic network when the washing machine is plugged to the domestic network.

In some embodiments, a monitoring system 100B may be located in electrical vicinity to load 212, but, not included in the circuitry of load 212. For example, monitoring system 100B may be located or installed at the end of an electrical branch. In yet another example, monitoring system 100B may be located at an electrical socket in which the electrical cable of load 212 (e.g., any an electrical device, such as a heating system) is to be plugged. Monitoring system 100B can also be included in an electricity sub-meter.

Is some embodiments, a system 100C may be located at an electrical vicinity to panel box 220 at the exit from the box to an electrical branch that connects load 213. For example, system 100C may be connected to panel box (e.g., fuse box) 220 after the fuse connected to the branch of load 213. System 100C may also be integrated into the panel-box. In modern electrical systems, a networked electricity-meter is included in the panel-box for purposes of monitoring. In some embodiments, monitoring system according to the present invention may be included in an electricity-meter.

In some embodiments, a system 100D may be located on the part of the electrical network that is between the source of the power supplied by the utility company (or any other independent power supply, such as battery or an independent generator) and the entry point to the local electrical distribution network (for example, before fuse box 220). The electrical wiring in the streets is an example for such segment of the electrical network. According to some embodiments of the present invention, utility companies may be able to detect faults in their part of the electrical-distribution system—before the fault causes problem(s) in the continuous supply of electrical power to their customers. An exemplary system 100D may be assembled in DC systems, where there is no central panel box. Residential heating and ventilation systems that include DC-powered fans may be examples to devices that include the usage of monitoring system 100D.

When the power source is AC—like power source 225—each of systems 100A-100D may be connected via a phase line and a neutral line. When the power source is DC—like power source 226—each of systems 100A-100D may be connected via a (+) line and a (−) line. AC power source 225 may feed panel box 220 via phase line 223 and neutral line 224. Alternatively, DC power source 226 may feed panel box 220 via (+) line 223 and (−) line 224. In some DC systems—there is no panel-box, and the electrical power is directly supplied to the loads (e.g., domestic air ventilators).

Figure 3:
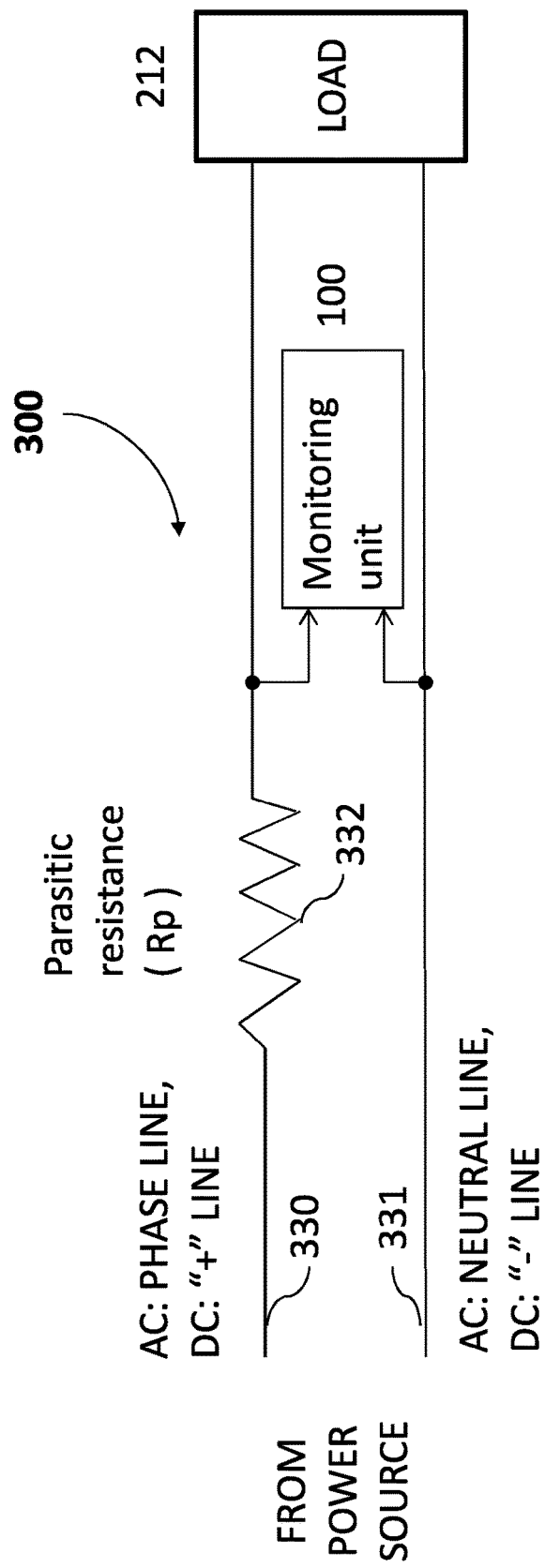
FIG. 3 is a schematic representation of an exemplary electric branch according to some embodiments of the invention.

Reference is made to FIG. 3 that is a schematic representation of an exemplary electrical branch according to some embodiments of the invention. Branch 300 may include two electrical lines 330 and 331 that may have a parasitic resistance $R_p$ 332. The electrical lines may be connected to monitoring system 100 that may be located in electrical vicinity to the load, for example, load 312, or at any point of interest at branch 300 like locations 100A-100D that are depicted in FIG. 2. Branch 300 may be fed by an AC power source and may have a phase line 330 and neutral line 331, or by a DC power source and may have (+) line 330 and (−) line 331.

The momentary voltage at an electrical load (e.g., load 312) connected to an electrical branch (e.g., branch 300) may be expressed by equation (1):

$$V_{load}(t)=V_{in}(t)-I(t)*R_p(t) \qquad (1)$$

Wherein:

$V_{load}(t)$=the voltage, in an electrical vicinity to the load, at time t;

$V_{in}(t)$=the voltage at the entry to the electrical branch, at time t;

$I(t)$=the electrical current in the electrical branch, at time t;

$R_p(t)$—the parasitic resistance of the electrical branch—between the entry to the facility and the load, at time t.

When $I(t)=0$—then $I(t)*R_p(t)$ is also 0, and the voltage at $V_{load}$ at time (t) is expressed by equation (2):

$$V_{load}(t)=V_{in}(t) \qquad (2)$$

The above equations may define the momentary voltage at a load located at the end of an electrical branch in an electrical vicinity to the load. However, electrical faults may occur at any point in the electrical network. Thus, monitoring system 100 may be placed and located at various points along the electrical branch such that electrical faults may be detected at any point in an electncal network, for example, as illustrated in FIG. 2 with respect to the location of systems 100A-100D.

The momentary voltage at any point of interest in the electrical network may be expressed by equation (3):

$$V_{point}(t)=V_{in}(t)-I(t)*R_p(t) \qquad (3)$$

Wherein:

$V_{point}(t)$=the voltage at a specific point in an electrical branch, at time t;

$V_{in}(t)$=the voltage at the entry to the electrical branch, at time t;

$I(t)$=the electrical current in the electrical branch, at time t;

$R_p(t)$—the parasitic resistance of the electrical branch—between the entry to the branch and the measurement, done by monitoring system 100, at the specific point, at time t, for example as illustrated in FIG. 3.

When $I(t)=0$—then $I(t)*R_p(t)$ is also 0, and the voltage at Vload at time (t) is expressed by equation (4):

$$V_{point}(t)=V_{in}(t) \qquad (4)$$

Figure 4:
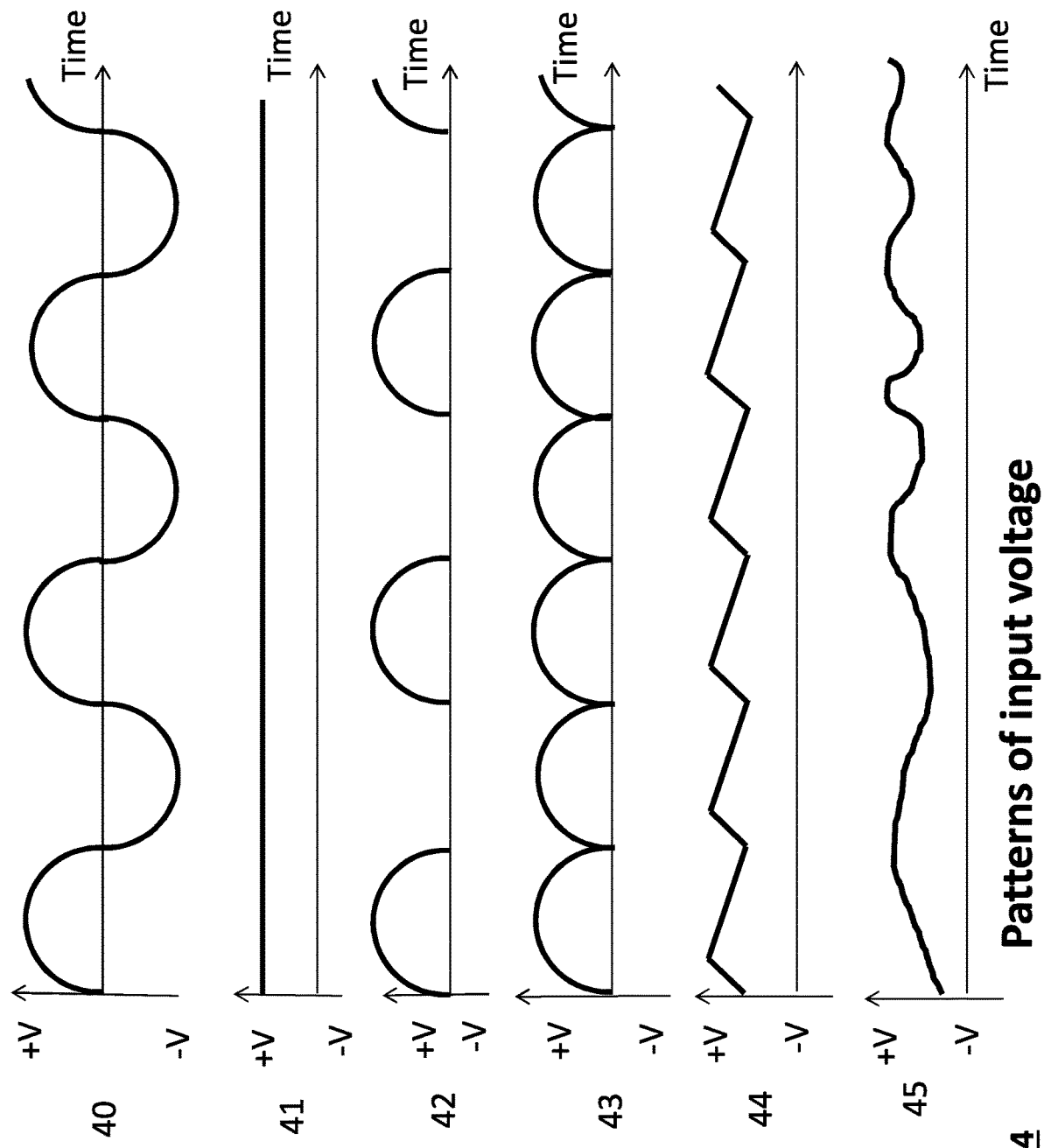
FIG. 4 is a schematic representation of exemplary input voltage patterns according to some embodiments of the invention.

Some examples of several optional input voltage $V_{in}(t)$ patterns according to some embodiments of the invention, are illustrated in FIG. 4.

Waveform 40 may be an alternating AC voltage that alternates with time. Waveform 41 is a steady constant voltage pattern, also known as battery voltage or regulated voltage. Waveform 42 is a half-wave rectification waveform converted from alternating voltage using a rectifier. Waveform 43 is a full-wave rectification waveform converted from alternating voltage using a rectifier that rectifies the whole alternating wave. Waveform 44 is a full-wave rectified voltage waveform that has ripple due to insufficient filtering. Waveform 45 is an example of voltage waveform with a random behavior.

When a load or device is operated (even in a standby mode) the current is not zero. Therefore $V_{point}(t)$ or $V_{load}(t)$ may have various optional temporal behaviors. Some examples of DC current waveforms under various DC voltage input and load operation modes are given in FIGS. 5, 6 and 7.

Figure 5:
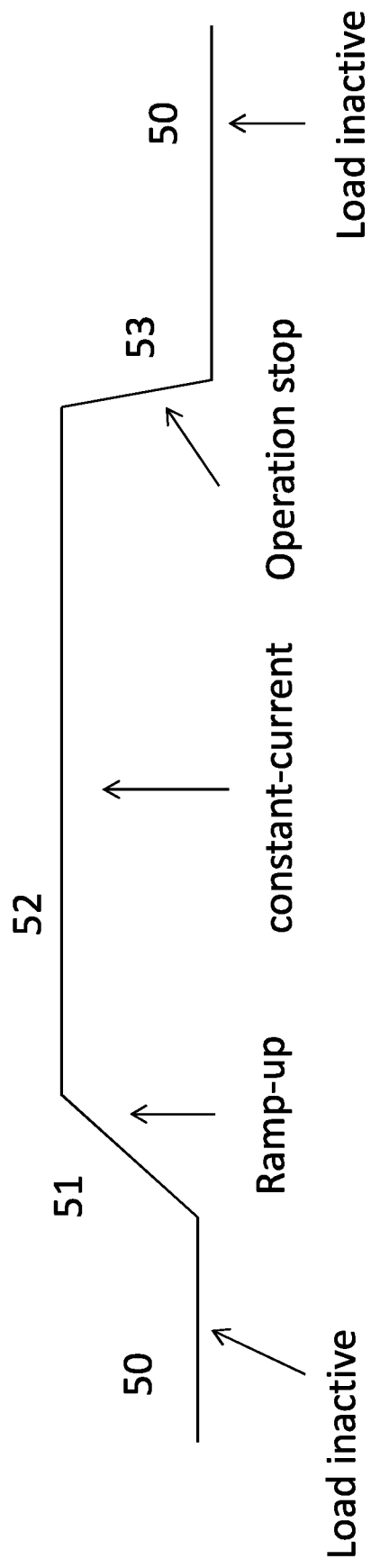
FIG. 5 is a schematic representation of an exemplary DC waveform of a current drawn by a load according to some embodiments of the invention.

An example for a non-zero waveform of current drawn by a load, under stable DC voltage and constant current operation (i.e., when during the entire operation of the load the current from the power supply is constant), is given in FIG. 5. FIG. 5 is a schematic representation of an exemplary DC waveform of a current under load according to some embodiments of the invention. When the load is inactive, section 50, no current is drawn by the load and $V_{point}(t)$ =Vin(t). As the load is being operated, for example—a 12V DC-operated flat-panel screen is turned on, the current starts to rise, in section 51, until it reaches a constant desired value at section 52. When the operation stops, for example, when the screen is turned off, the current in section 53 may drop to zero, and stay zero in section 50 until the next activation of the screen. The voltage at sections, 51, 52 and 53, at the point in which monitoring system 100 may be connected, is expected to be $V_{point}(t)=V_{in}(t)-I(t)*R_p(t)$. In this mode—control-unit 12 will notify the system that the voltage and current measured are constant In another system-configuration—measurement-processor 13 may find that the voltage and current measured are constant, and notify that to the deviation-processor 16. Afterwards, deviations from the behavior described by equation (3) may be detected by the deviation-processor 16. After detection of a deviation, the deviation may be analyzed. A change in the voltage measured, without a parallel change in the current, may probably be an indication for a fault. A change in Rp, may indicate a fault, while a change in the measured voltage, accompanied by a change in the measured current that according to equation (3)—may indicate a normal change.

Figure 6:
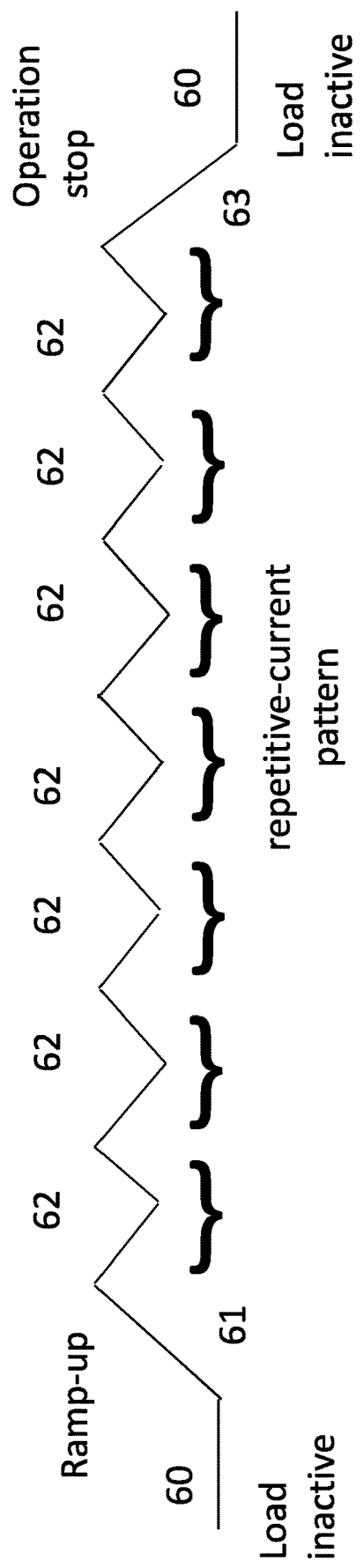
FIG. 6 is a schematic representation of an exemplary DC repetitive waveform of a current drawn by a load according to some embodiments of the invention.

An example for a waveform of pulsating DC current drawn by a load with a repetitive pattern is given in FIG. 6. FIG. 6 is a schematic representation of an exemplary repetitive pattern of a current under load according to some embodiments of the invention. At the beginning of the operation cycle, when the load is inactive, in section 60, the current is zero and the voltage at the monitored point (where system 100 is connected) is $V_{point}(t)=Vin(t)$. When the load is activated the current is raised until a desired value at section 61, then the load draws current at a repetitive pattern having repetitions 62, for example, when a DC-powered fan is operative. When the load is shut down, an immediate drop in the current occurs at section 63, until the current is brought to zero in section 60. During sections 61, 63 and repetition 62 the voltage at the monitored point may be $V_{point}(t)=V_{in}(t)-I(t)*R_p(t)$. Control-unit 12 may notify system 100 that the voltage and current measured should be periodic. In some embodiments, the measurement-processor 13 may find that the voltage and current measured are periodic, and notify that to the deviation-processor 16.

Measurement-processor 13 may find the repetition-pattern in the measured voltage and/or current values and may store these patterns in waveform storage 14. Afterwards, deviation-processor 16 may compare the stored voltage and/or current patterns with a momentary measured voltage and/or current values. Deviation-processor 16 may analyze the detected deviations. A momentary deviation, followed by return-to-pattern, may probably be an indication of a momentary, unexpected change in the input voltage, which may be an electrical fault. Such a momentary deviation may be the result of a loose-connection on the electrical distribution system, which may be an electrical fault. A deviation that appears to be due to operation-stop may be regarded as a normal deviation.

Figure 7:
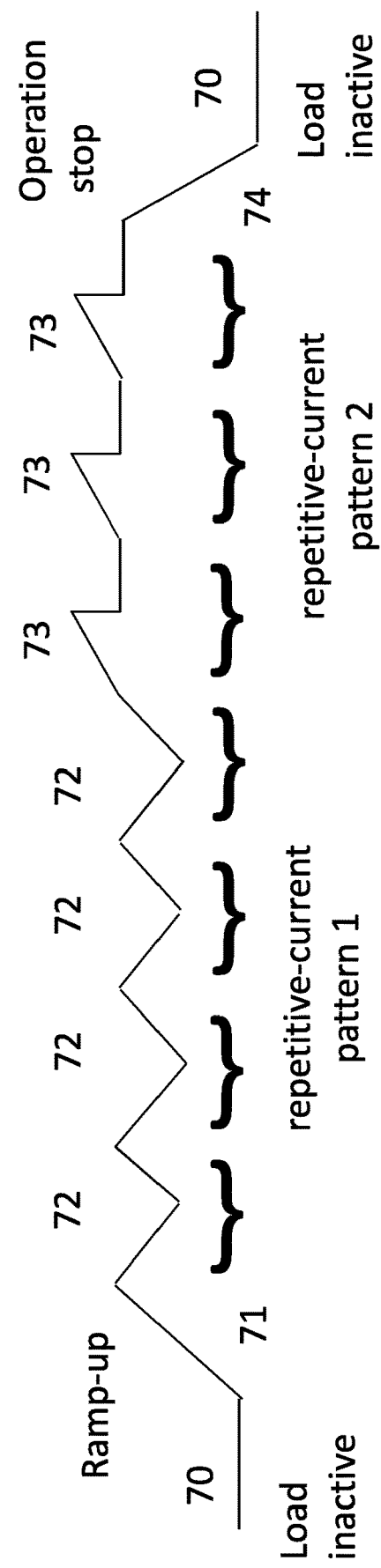
FIG. 7 is a schematic representation of an exemplary DC repetitive waveform comprising multiple repetitions, of a current drawn by a load according to some embodiments of the invention.

An example for a non-zero waveform of pulsating DC current drawn by a load having a multiple repetitive patterns—is given in FIG. 7. FIG. 7 is a schematic representation of an exemplary repetitive waveform comprising multiple repetitions, of a current under load according to some embodiments of the invention. When the load is not active, in section 70, the voltage at the monitored point is $V_{point}(t)=Vin(t)$. When the load is activated, the current is raised until a desired value at section 71. During a first operation mode, for example, during one mode of a DC-operated fan, the current may have a first pattern having repetitions 72. During a second operation mode, for example, during a second mode of that DC-operated fan, the current may have a second pattern having repetitions 73. When the load is shut down, the current drops to zero at section 74, until the load is not operative. During sections 71, 74 and repetitions 72 and 73 the voltage at the monitored point may be $V_{point}(t)=V_{in}(t)-I(t)*R_p(t)$. The operation of system 100 may be similar to the operation described with respect to FIG. 6. However, as multiple patterns are expected in this mode, when a deviation from a pattern is detected, system 100 may first try to match the momentary measured voltage and/or current values—with all the patterns included in the waveform. If such a match is found, then system 100 may continue its operation, assuming that the detected momentary value as belong to the next pattern included in the waveform. If such a match is not found, system 100 may handle the deviation in a manner similar to that described above for FIG. 6.

Figure 8:
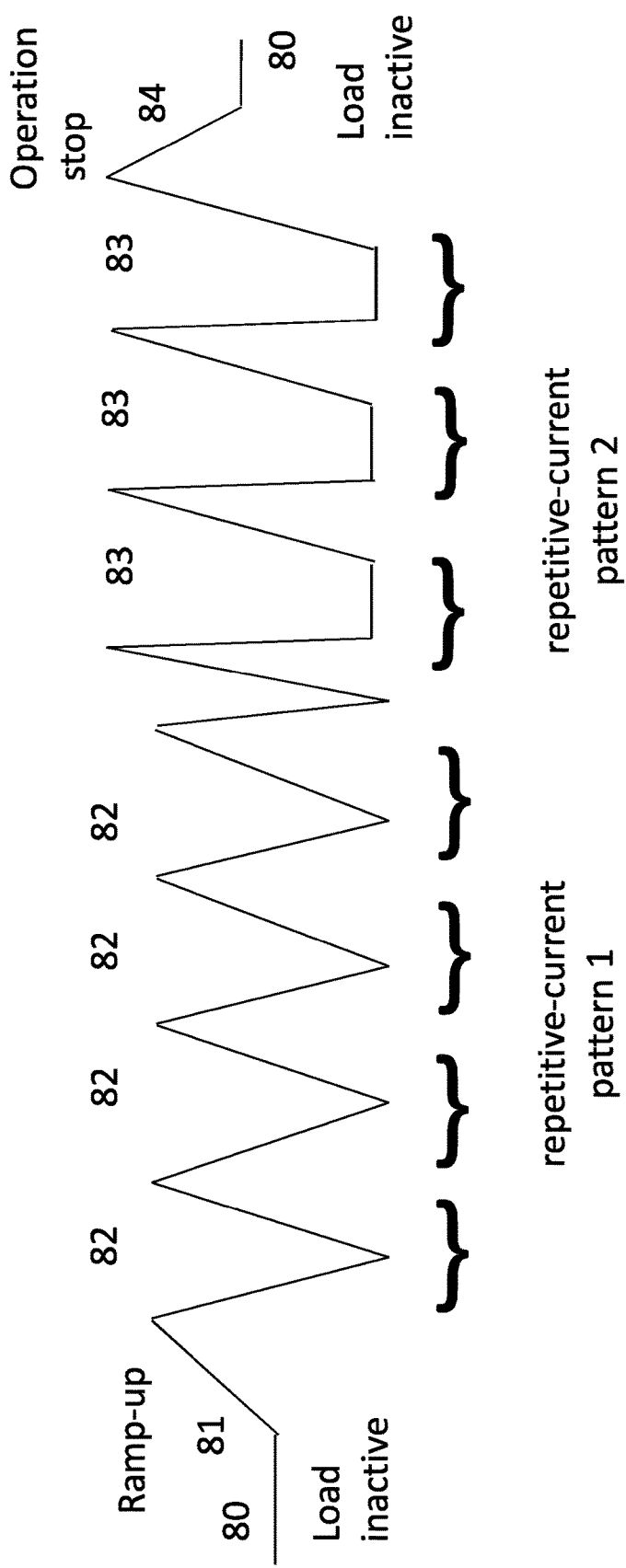
FIG. 8 is a schematic representation of an exemplary AC waveform comprising multiple repetitive patterns of load operation, according to some embodiments of the invention.

An example for AC current drawn by a load, having multiple repetitive patterns, is given in FIG. 8. FIG. 8 is a schematic representation of an exemplary AC waveform comprising multiple repetitive patterns of load operation according to some embodiments of the invention. When the load is not active, in section 80, the voltage at the monitored point is $V_{point}(t)=Vin(t)$. When the load is activated, the current is raised until a desired value at section 81, to one of the alternating current values (either the positive or the negative). During a first operation mode, for example, during the washing mode of a washing machine, the current may have a first alternating pattern having repetitions 82. During a second operation mode, for example, during the wringing mode of the washing machine, the current may have a second alternating pattern having repetitions 83. When the load is shutdown, the current drops to zero at section 84, until the load is not operative. During sections 81, 84 and repetitions 82 and 83 the voltage at the monitored point may be $V_{point}(t)=V_{in}(t)-I(t)*R_p(t)$. System 100 may detect deviations of voltage and/or current values measured from the accepted values in a manner that may be similar to the operation described for the previous examples.

In some embodiments, system 100 may detect faults or deviations from an acceptable electrical behavior both when the electrical network is loaded and when the electrical network is not loaded (i.e., all the loads connected to the various branches of the electrical network are inactive). Although it may be important to detect electrical faults when the electric net is loaded, particularly when the net may be loaded simultaneously with several loads, it may be also important to be able to detect faults when the net is unloaded. Some faults may occur in the wires forming the net, or the sockets/plugs connected at any point of each branch in the net. Some electrical systems may be mobile, for example, passenger trains, where the locomotive is actually a power generator that supplies electricity to various electrical engines that spin the wheels. Such mobile systems may be even more sensitive to potential faults and damages in the electrical circuits and wires forming the electric net.

The waveforms in FIGS. 4, 5, 6, 7 and 8 are given as examples for waveforms having an acceptable electrical behavior. Parameters or values related to those waveforms may be used as one or more acceptable values related to the electrical behavior at the point of interest, for example, when the point of interest is where monitoring system 100 was connected. Measurements of such waveforms may be taken by voltage sensor 10 and/or current sensor 11 and stored as values related to the electrical behavior at waveform storage 14 and/or parameter storage 15. For example, the waveforms of FIGS. 4-8 may be stored at waveform storage 14 and parameters related to the waveforms of FIGS. 4-8 (e.g., minimum and maximum current/voltage values, the number of expected repetition-patterns, etc.) may be stored at parameters storage 15.

Deviations from an acceptable electrical behavior may be referred to in terms of duration and amplitude. Deviations may be continuous in time, partially continuous in time or may be almost discreet. A continuous deviation may occur as an ongoing or repeatable disturbance in the current and/or voltage waveform. A partially continuous deviation may occur as an ongoing or repeatable disturbance at only a portion of the cycle or for a limited number of cycles (e.g., a partially continuous deviation may occur in only one or two cycles from a plurality of cycles). In many electrical faults there may be a process of degradation over time. Thus, faults may occur for a short period of time before they begin to occur for longer periods of time. The distinction between low and high amplitude deviations is determined according to the preferences of a user of the present invention. One preference may include comparing detected deviation parameters to pre-defined deviation-thresholds. Another preference may include the ability to learn the expected value from the received measurement values. This may be beneficial when system 100 is used in a noisy environment, or when the system 100 is installed in an electrical system that is already affected by one or more known electrical faults.

Figure 9:
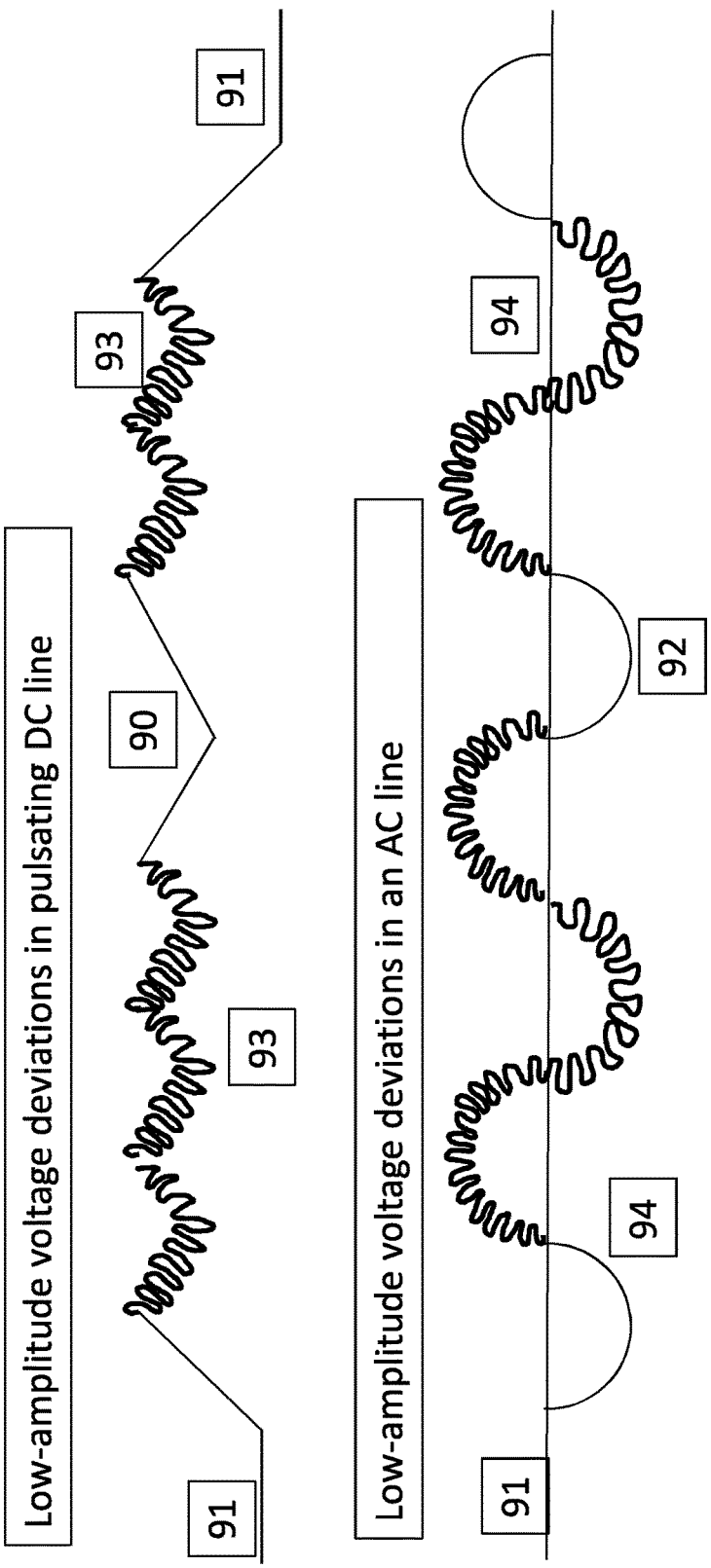
FIG. 9 is a schematic representation of exemplary waveforms comprising low-amplitude deviations from acceptable behavior according to some embodiments of the invention.

Examples for two low-amplitude deviations (partially continuous deviations) in pulsating DC and AC voltage/current waveforms are given in FIG. 9. Pulsating DC current waveform 90 has a base 91, in which the current is zero. DC pulsating waveform 93 depicts the part of the load activity in which there is no deviation of the actual voltage and/or current from the expected one. DC pulsating current waveform 90 deviate from an acceptable pulsating DC waveform, such as the current waveform of FIG. 6, by having a low amplitude deviation during the at least a portion or a significant part of the operation time, e.g., the deviation is low amplitude and partially continuous. In yet another example, AC voltage/current waveform 92 deviate from an acceptable AC waveform, such as waveform 94 or waveform 40 illustrated in FIG. 4, by having a low amplitude deviation during at least a portion, or a significant part of the operation time.

Deviation-processor 16 may compare voltage/current waveform 92 to voltage/current waveform 94 or voltage/current waveform 40 by for example, applying a Fourier transformation. The values related to the electrical behavior at such example, may be the frequencies or the harmonies detected. The acceptable value related to waveform 40 may include a single frequency that is a result of applying Fourier transformation to waveform 40, while when applying Fourier transformation to waveform 94, two or more frequencies or harmonies may be obtained, a first frequency related to the base waveform and one or more frequencies related to the low amplitude partially continuous deviation. The first frequency may be similar to the acceptable frequency value that was stored in parameter storage 15. However, the other frequencies may be the cause of the deviation from the acceptable electrical behavior and may indicate a problem or a fault, either in the electrical system of the load or the electrical branch in which monitoring system 100 is connected or at any other point in the electrical system. A vibrating contact on the panel-box may be detected by this method.

In some embodiments, methods of filtering and frequency-transformations may be used when the deviation has a noticeable duration. Short, low-amplitude deviation may not be easily detected by filtering and/or frequency-transformations. Deviation-processor 16 may also detect the presence of low-amplitude deviations by using digital functions, for example, like time-synchronization of the expected voltage and/or current waveform values to the received waveform values, followed by subtracting the expected values from the values actually received. The result of this subtraction enables fast detection of low-amplitude deviations, even if they occur for a short period of time.

Deviation-processor 16 may send an alert when the amplitudes of one or more additional frequencies are larger than threshold values. A similar analysis by deviation-processor 16 may be performed by comparing the actual waveforms with the expected waveform, for example, comparing the actual waveform of FIG. 9 with the expected waveform of FIG. 6.

Figure 10:
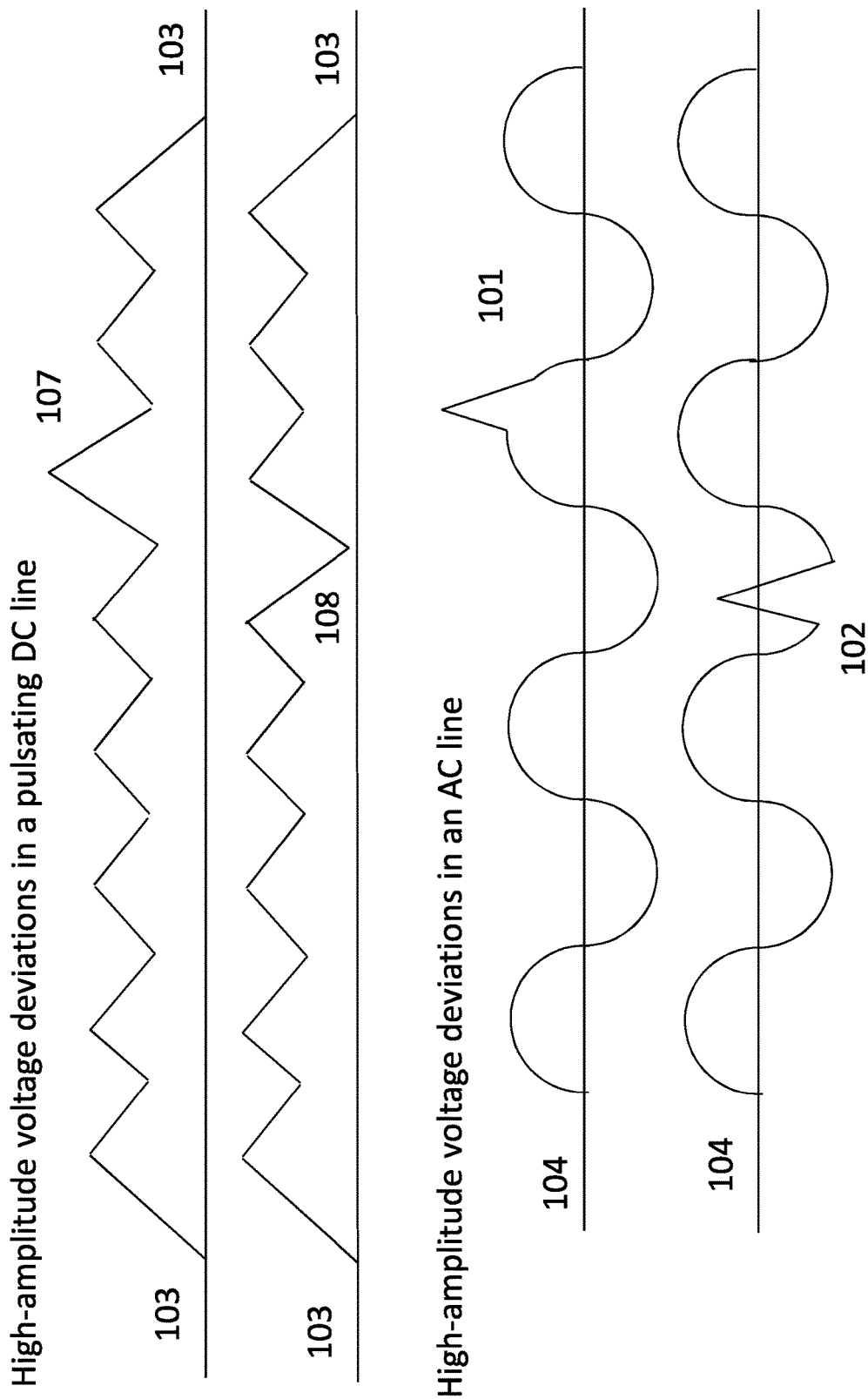
FIG. 10 is a schematic representation of exemplary waveforms comprising high-amplitude deviations from acceptable behavior according to some embodiments of the invention.

FIG. 10 is a schematic representation of exemplary pulsating-DC and AC waveforms comprising non-continuous deviations from an acceptable behavior according to some embodiments of the invention. Waveform 103 is an exemplary pulsating-DC waveform and waveform 104 is an exemplary AC waveform. Two exemplary deviations may be detected in waveform 103. Deviation 107 is an increase in the voltage/current (e.g., a singular increase) and deviation 108 is a decrease in the voltage/current. Deviation-processor 16 may detect deviation 107 by comparing the maximum voltage/current value of waveform 103 (the values of deviation 107) to a waveform maximum acceptable value stored in parameter storage 15. For example, the acceptable value may be the maximum value of the acceptable waveform of FIG. 6. Alternatively, deviation-processor 16 may analyze waveform 103 repetitions and maximum values and compare the majority of substantially similar maxima with any maximum deviation from the majority maxima. The same analysis may be made, by deviation-processor 16 for detecting deviation 108, using either stored acceptable minimum values related for example, to the waveform of FIG. 6, or by analyzing the majority of minima values of waveform 103.

Deviation-processor 16 may further be configured to detect deviations in exemplary AC waveform 104. Two exemplary deviations may be detected in waveform 104, deviation 101 is a singular increase in the voltage/current value at the positive maximum of AC waveform 104 and deviation 102 is a singular increase in the voltage/current value at the negative maximum of AC waveform 104. Deviation 101 occurs when the voltage/current values are positively higher than the expected or accepted values of an acceptable AC waveform. Deviation 102 occurs when the voltage/current values are less negative and possibly even positive than the expected or accepted values of an acceptable AC waveform.

In order to detect deviation 101, deviation-processor 16 may compare the maximum voltage/current value measured in deviation 101 to the maximum voltage/current value related to an acceptable AC waveform, stored in parameters storage 15, for example, a maximum value related to waveform 40. However, in order to the detect deviation 102, comparing maximum/minimum values of the waveform may not be enough and a more careful analysis may be required. This may be required when the voltage/current values measured during deviation 102 may not exceed the acceptable maximum/minimum values allowed for waveform 104. For example, deviation-processor 16 may process all the measured current/voltage values in a single cycle or for a predetermined number of cycles and may compare them with acceptable values related to single cycle or an number of cycles stored in waveform storage 14, for example, the cycles of waveform 40. Additionally, if a repeating pattern may be found by measurement-processor 13 in waveform 104, the repeating pattern may be stored in waveform storage 14. Deviation-processor 16 may compare the pattern stored in waveform storage 14 with the momentary measured voltage and/or current values. A detected deviation that may be larger than a previously defined threshold will be analyzed, and fault indication may be generated when required.

In some embodiments, the main difference between low and high amplitude deviations is the ability to extract and regenerate the expected waveform from the received waveform regardless of the waveforms continuity over time. In the presence of low-amplitude deviations, whether continuous or composed of bursts, the expected waveform may be restored quite easily. However, in the case of high-amplitude deviations that may occur for a relatively-long period of time, restoring the expected waveform may be harder and more complicated.

Faults that create low-amplitude deviations may occur in a manner of bursts. If the bursts become continuous, it means that the fault became more severe. In order to detect the fault as early as possible it may be required to detect also bursts of low-amplitude deviations, not merely continuous ones.

Figure 11:
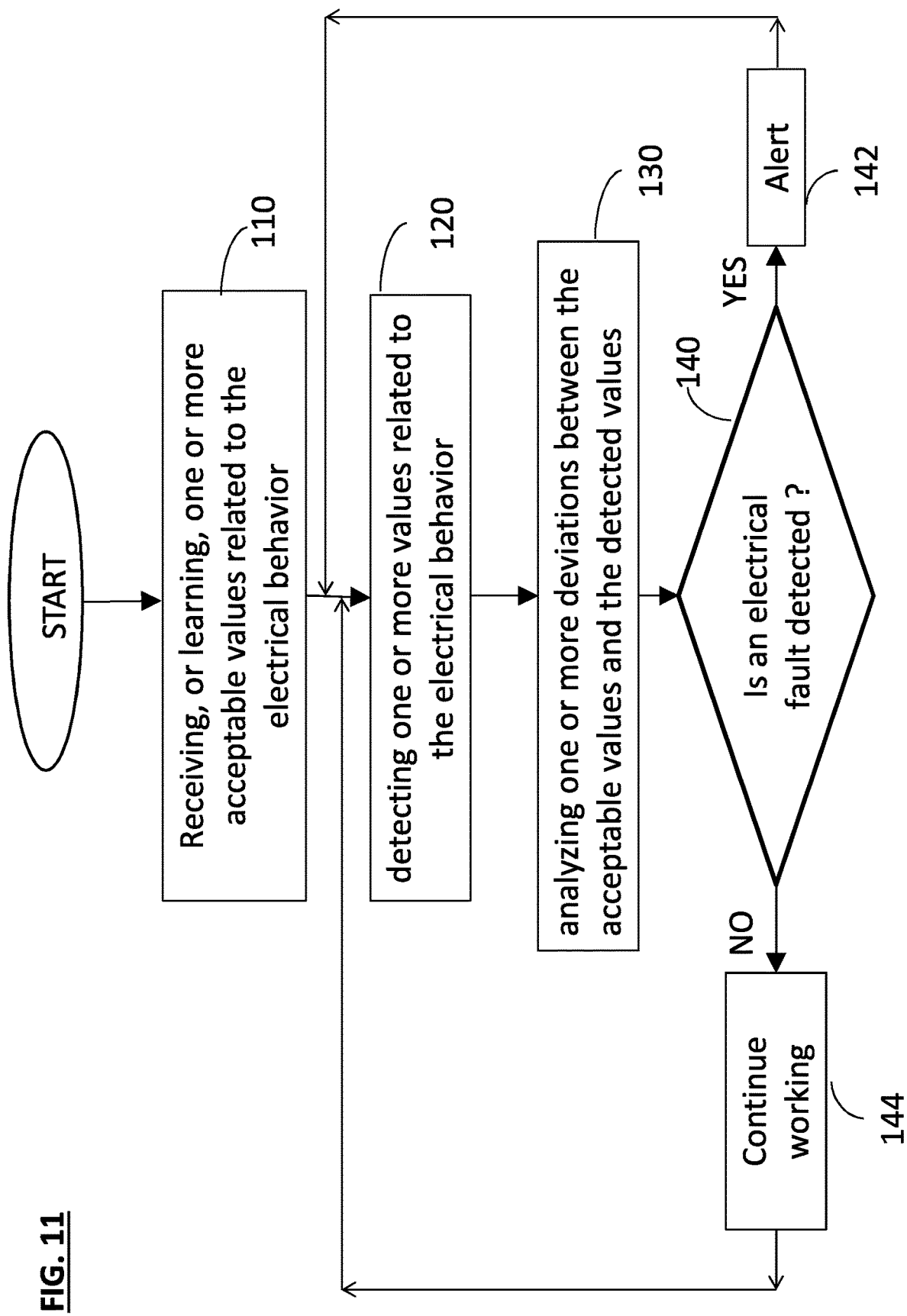
FIG. 11 is a flowchart that depicts a method of detecting one or more deviations from an acceptable electrical behavior according to some embodiments of the invention.

Reference is now made to FIG. 11 that is a flowchart of a method of detecting deviations from an acceptable electrical behavior according to some embodiments of the invention. The method of FIG. 11 as well as other methods according to embodiments of the invention may be performed by a system for detecting one or more deviations from an acceptable electrical behavior at a point of interest in an electrical network, for example, monitoring system 100. Instructions to perform the method by, for example, a processor, may be stored in a memory that may be associated with an analyzer unit (e.g., part of deviation-processor 16) included in the system. In yet another embodiment, the method of FIG. 11 may be performed by digital logic like state-machines and/or other logic devices without use of a processor.

In operation 110, the method may include receiving one or more acceptable values related to the electrical behavior at the point of interest. A system, such as system 100, may be placed at a point of interest on an electric network, for example, at an electrical vicinity to a load (e.g., a device powered by electricity), for example as illustrated in FIG. 2. In some embodiments the point of interest may be at a junction in the electric network or in a part that is feeds two or more loads. Thus, the one or more acceptable values related to the electrical behavior may be a superposition of acceptable values in an electrical vicinity of each load.

In some embodiments, the electrical behavior may be related to at least one of: a voltage waveform and a current waveform. Values related to the electrical behavior may include maximum and minimum values of at least one of: the voltage pattern and the current pattern. Additionally or alternatively, values related to the electrical behavior may include one or more expected repetition-patterns in at least one of: the voltage waveform and the current waveform and/or a full pattern of: at least one of the voltage pattern and the current pattern, for example, the patterns in FIGS. 4-8. Some examples of values related to the electrical behavior are given in table 1.

The one or more acceptable values related to the electrical behavior at the point of interest may be received from an external device, for example, a database related to a manufacturer of the load (e.g., the website of a washing machine manufacturer) or may be stored at a storage associated with the controller of the load (e.g., stored in a memory included in the washing machine control unit) that may communicate directly with system 100, using wired or wireless communication. Alternatively, one or more acceptable values related to the electrical behavior at the point of interest may be measured at the point of interest by sensors included in system 100, and stored in waveform storage 14 and/or parameter storage 15. The one or more values related to the electrical behavior at the point of interest may be learned by the system 100 by being measured over time, analyzed, cleaned and/or processed by measurement-processor 13 and/or deviation-processor 16 and then stored and used as acceptable values related to the electrical behavior at the point of interest.

In some embodiments, the method may include determining the one or more acceptable values related to the electrical behavior based on a superposition between the one or more acceptable values associated with the load and one or more acceptable values associated with the electric network. After receiving from the external source (e.g., the load's manufacturer) the one or more acceptable values related to an electrical behavior associated with the load, the method may include receiving one or more acceptable values related to an electrical behavior associated with the electric network, for example, the waveforms at FIGS. 4-8, conducting superposition of the two values.

In operation 120, the method may include detecting one or more values related to the electrical behavior at a point in time at the point of interest. The one or more values may be detected or measured using a voltage sensor, such as sensor 10 and/or a current sensor, such as sensor 11. The detected value(s) may further be processed by measurement processor 13 to gain a better, cleaner measured value(s).

In operation 130, the method may include analyzing one or more deviations between the acceptable values and the detected values. The analysis may be done by comparing the detected values and the acceptable values. Some examples of such comparison were given above with respect to FIGS. 5-10. In some embodiments, if an electrical fault is detected, for example, if the deviation detected is higher than a threshold value, then in operation 140, an alert may be sent in operation 142, alerting that a fault has occurred in the electrical network or a load connected to the network. The alert may further include the location of the detected fault, or at least the location of the monitoring system that detected the deviation.

In some embodiments, the alert may be sent, using an external interface 17, to a user, for example, by sending an alert to the user's personal computer or home control system or building control system or portable communication device such as a mobile phone. The alert may be sent, using external interface 17 to an external device, for example, a controller that controls all electronic operations of electronic devices at a home (a "smart home"), or a controller that controls the operation of all the industrial devices (e.g., furnaces, ovens, reactors or any other industrial equipment that consumes electricity). The external device may automatically invite a technician to fix the electric fault, or run an additional checkup to further investigate the detected deviation.

In some embodiments, if an electrical fault is not detected, for example, if the deviation detected is not higher than a threshold value, then in operation 140, the monitoring system may continue working, by moving to operation 144 and then loop back to operation 120, until a deviation is detected and afterwards.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A system for detecting and processing one or more deviations from an acceptable electrical behavior at a point of interest in an electrical network, the system comprising:
    a voltage sensor and a current sensor;
    a measurement-processor configured to process measurements received from the voltage sensor and the current sensor;
    at least one storage for storing one or more acceptable values related to the electrical behavior at the point of interest; and
    a deviation-processor configured to:
        receive from the voltage sensor and the current sensor, one or more detected values related to the electrical behavior at a point in time at the point of interest; and
        detect one or more deviations between the one or more acceptable values and the one or more detected values, and
        analyze one or more deviations between the one or more acceptable values and the one or more detected values,
    wherein, the electrical behavior is related to a voltage waveform and a current waveform,
    wherein the measurement-processor is further configured to detect a repetition-pattern in the measured voltage and current values and store the voltage and current values associated with the repetition-pattern on the at least one storage;
    wherein the deviation-processor is further configured to compare the stored voltage and current values associated with the repetition-pattern with momentary measured voltage and current values.

2. The system of claim 1, further comprising:
    a control unit; and
    an external interface,
        wherein, the control unit is configured to receive the one or more acceptable values related to the electrical behavior from an external source.

3. The system of claim 2, wherein the controller is further configured to send an alert via the external interface when the analyzed deviation is higher than a threshold value.

4. The system of claim 3, wherein the alert is sent to a user and an external device.

5. The system according to claim 1, wherein the measurement-processor and the deviations-analyzer and are included in a single computation platform.

6. The system according to claim 1, wherein the electrical network is loaded by at least one electric load.

7. The system according to claim 1, wherein the electrical behavior is related to maximum and minimum values of the measured voltage waveform and the measured current waveform.

8. The system according to claim 1, wherein the electrical behavior is related to a one or more expected repetition-patterns in the voltage pattern and the current pattern.

9. The system according to claim 1, wherein the electrical behavior is related to a full pattern of the voltage pattern and the current pattern.

10. The system according to claim 1, wherein the electrical behavior is related to a time derivative of the voltage waveform and the current waveform.

11. A method of detecting and processing one or more deviations from an acceptable electrical behavior at a point of interest in an electrical network, the method comprising:
    receiving acceptable current and voltage values related to the electrical behavior at the point of interest;
    measuring current and voltage values related to the electrical behavior at a point in time at the point of interest;
    detecting a repetition-pattern in the measured voltage and current values and storing the voltage and current values associated with the repetition-pattern;
    comparing the stored voltage and current values associated with the repetition-pattern with momentary measured voltage and current values; and
    analyzing one or more deviations between the acceptable values and the detected values, wherein, the electrical behavior is related to a voltage waveform and a current waveform.

12. The method of claim 11, wherein the electrical network is loaded by at least one electric load.

13. The method according to claim 11, wherein the electrical behavior is related to maximum and minimum values of the voltage pattern and the current pattern.

14. The method according to claim 11, wherein the electrical behavior is related to one or more expected repetition-patterns in the voltage waveform and the current waveform.

15. The method according to claim 11, wherein the electrical behavior is related to a full pattern of the voltage pattern and the current pattern.

16. The method according to claim 11, wherein the electrical behavior is related to a time derivative of the voltage pattern and the current pattern.

17. The method according to claim 11, further comprising sending an alert when the deviation is larger than a threshold value.

18. The method according to claim 11, wherein receiving one or more acceptable values related to the electrical behavior is from an external source.

19. The method according to claim 11, wherein receiving the one or more acceptable values related to the electrical behavior is from a storage comprising previously detected and analyzed voltage pattern and current pattern.

20. The method of claim 18, wherein receiving the one or more acceptable values related to the electrical behavior comprises:
- receiving from the external source the one or more acceptable values related to an electrical behavior associated with the load;
- receiving the one or more acceptable values related to an electrical behavior associated with the electric network; and
- determining the one or more acceptable values related to the electrical behavior based on a superposition between the one or more acceptable values associated with the load and the one or more acceptable values associated with the electric network.

* * * * *